(12) United States Patent
Pan et al.

(10) Patent No.: US 7,763,962 B2
(45) Date of Patent: Jul. 27, 2010

(54) WAFER-LEVEL PACKAGING OF MICRO DEVICES

(75) Inventors: Shaoher X. Pan, San Jose, CA (US); Vlad Novotny, Los Gatos, CA (US)

(73) Assignee: Spatial Photonics, Inc., Sunnyvale, CA (US)

( * ) Notice: Subject to any disclaimer, the term of this patent is extended or adjusted under 35 U.S.C. 154(b) by 704 days.

(21) Appl. No.: 11/558,883

(22) Filed: Nov. 10, 2006

(65) Prior Publication Data
US 2008/0111203 A1    May 15, 2008

(51) Int. Cl.
*H01L 23/20* (2006.01)
(52) U.S. Cl. .................. 257/682; 257/913
(58) Field of Classification Search .......... 257/682, 257/913, FOR. 144, FOR. 146, E21.221, 257/E21.318
See application file for complete search history.

(56) References Cited

U.S. PATENT DOCUMENTS

| | | | |
|---|---|---|---|
| 4,626,941 A | 12/1986 | Sawada et al. | |
| 5,804,917 A | 9/1998 | Takahashi et al. | |
| 6,844,623 B1 * | 1/2005 | Peterson et al. | 257/723 |
| 6,992,810 B2 | 1/2006 | Pan et al. | |
| 7,091,605 B2 * | 8/2006 | Boroson et al. | 257/723 |
| 7,167,298 B2 | 1/2007 | Pan et al. | |
| 7,417,307 B2 * | 8/2008 | Haluzak et al. | 257/682 |
| 2003/0143423 A1 | 7/2003 | McCormick et al. | |
| 2003/0211644 A1 * | 11/2003 | Boroson et al. | 438/26 |
| 2005/0062174 A1 | 3/2005 | Ingle | |
| 2006/0076637 A1 * | 4/2006 | Gally et al. | 257/433 |
| 2007/0115532 A1 | 5/2007 | Chen et al. | |
| 2008/0226902 A1 * | 9/2008 | Giannantonio et al. | 428/336 |
| 2009/0072380 A1 * | 3/2009 | Tarn | 257/700 |
| 2009/0098685 A1 * | 4/2009 | Duboc et al. | 438/116 |

OTHER PUBLICATIONS

Shaoher X. Pan et al., "Micro Device Encapsulation", U.S. Appl. No. 11/379,932, filed Apr. 24, 2006, 29 pp.
Chii Guang Lee et al., "Fast-Response Micro-Mechanical Devices", U.S. Appl. No. 11/292,329, filed Nov. 30, 2005, 57 pp.

* cited by examiner

*Primary Examiner*—S. V Clark
(74) *Attorney, Agent, or Firm*—Fish & Richardson P.C.

(57) ABSTRACT

An encapsulated device includes a micro device on a substrate, a cover bonded to the substrate thereby forming a chamber to encapsulate the micro device, and a desiccant material on the cover and in the chamber. An anti-stiction material is absorbed in the desiccant material.

9 Claims, 5 Drawing Sheets

WAFER-LEVEL PACKAGING OF MICRO DEVICES

BACKGROUND

The present disclosure relates to the packaging of micro devices.

In manufacturing micro devices, multiple micro devices are commonly fabricated on a semiconductor wafer. The micro devices are subsequently packaged and separated into individual dies. Many types of micro devices must be in a sealed environment to prevent damage to the micro devices and ensure a long useful life of the device. It is therefore desirable to have an efficient process for providing hermetic sealing of the multiple micro devices on the semiconductor wafer.

SUMMARY

In one general aspect, the present invention relates to an encapsulated device including a micro device on a substrate; a cover bonded to the substrate thereby forming a chamber to encapsulate the micro device; and a desiccant material and in the chamber, wherein an anti-stiction material is absorbed in the desiccant material.

In another general aspect, the present invention relates to a method for encapsulating a micro device. The method includes disposing a desiccant material on a cover or the micro device wafer; absorbing an anti-stiction material into the desiccant material; and bonding the cover to a substrate to form a chamber encapsulating the micro device.

In another general aspect, the present invention relates to a method for encapsulating a micro device on a substrate. The method includes depositing an anti-stiction material on a plurality of surfaces of the micro device; selectively removing the anti-stiction material from a surface of the micro device; and bonding a cover to the substrate to form a chamber to encapsulate the micro device.

Implementations of the system may include one or more of the following features. The desiccant material can include at least one of a dehydrated metal halide, salt, silicate, oxide, hydroxide, halide, sulphate, perchlorate, carbonate, or activated carbon. The desiccant material can include calcium oxide or silicon oxide. The anti-stiction material can include at least one of tridecafluoro-1,1,2,2,-tetrahydrooctyltrichlorosilane (FOTS), heptadecafluoro-1,1,2,2,-tetrahydrodecyltrichlorosilane (FDTS), tridecafluoro-1,1,2,2,-tetrahydrooctyl triethoxysilane, bis-pentafluorophenyl dimethoxysilane, 3,3,3,-trifluoropropyl trichlorosilane, nonafluorohexyl trimethoxysilane, octadecyltrichlorosilane (OTS), perfluorodecanoic acid (PFDA), perfluoropolyether (PFPE) (e.g., Fomblin® PFPE) or a thiole. The micro device can include a first component configured to move and contact a second component. The encapsulated device can further include an anti-stiction material on at least one of the first component or the second component to prevent stiction between the first component and the second component. The encapsulated device can further include a spacer on the cover, wherein the spacer is bonded to the substrate.

Various implementations of the methods and devices described herein may include one or more of the following advantages. The disclosed system and methods can improve the reliability of the micro devices. Moisture may be effectively removed from the environment of an encapsulated micro device to reduce the likelihood of operational failure. Reducing moisture in the device's environment can reduce degradation of the micro device. Anti-stiction material may be replenished onto the surfaces of the encapsulated micro device during its operations to overcome stiction problems known in certain micro devices. Anti-stiction material can be applied to the surfaces of a micro device before encapsulation. A plurality of micro devices can be simultaneously encapsulated in one or more chambers at high throughput.

Although the invention has been particularly shown and described with reference to multiple embodiments, it will be understood by persons skilled in the relevant art that various changes in form and details can be made therein without departing from the spirit and scope of the invention.

BRIEF DESCRIPTION OF THE DRAWINGS

The following drawings, which are incorporated in and form a part of the specification, illustrate embodiments of the present invention and, together with the description, serve to explain the principles, devices and methods described herein.

DETAILED DESCRIPTION

Figure 1:
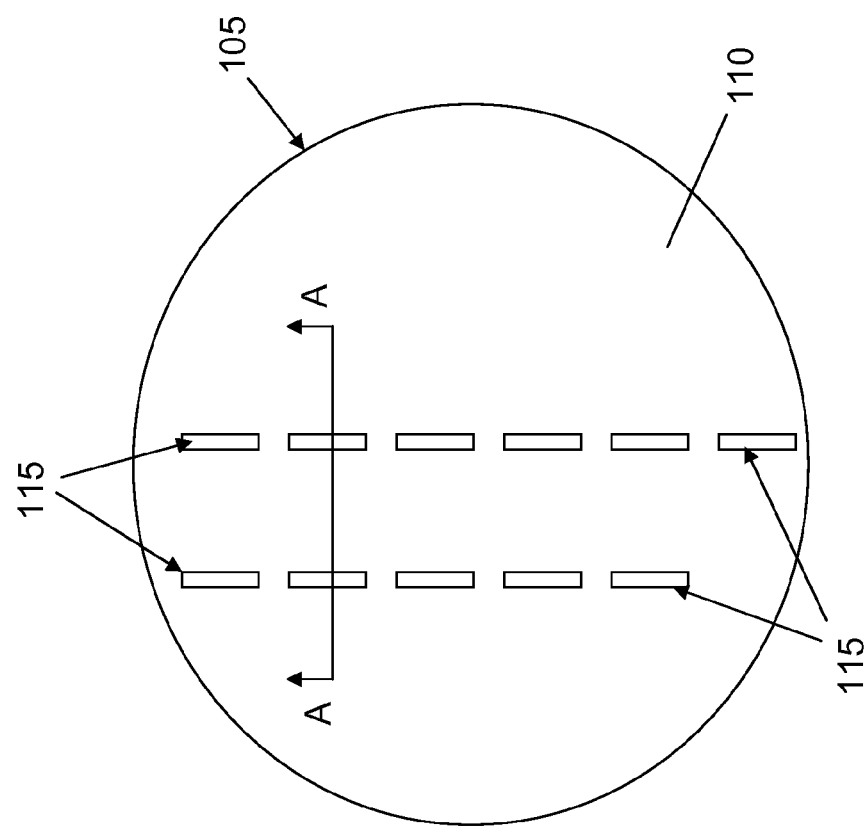
FIG. 1 is a plan view of an encapsulation device.
Figure 2:
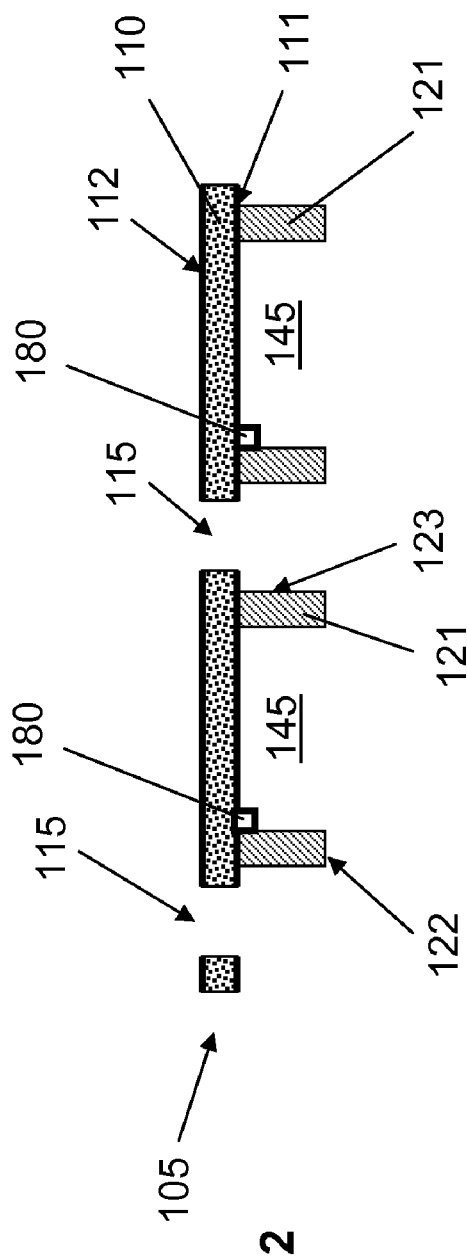
FIG. 2 is an exploded cross-sectional view of the encapsulation device along the line A-A in FIG. 1.
Figure 3:
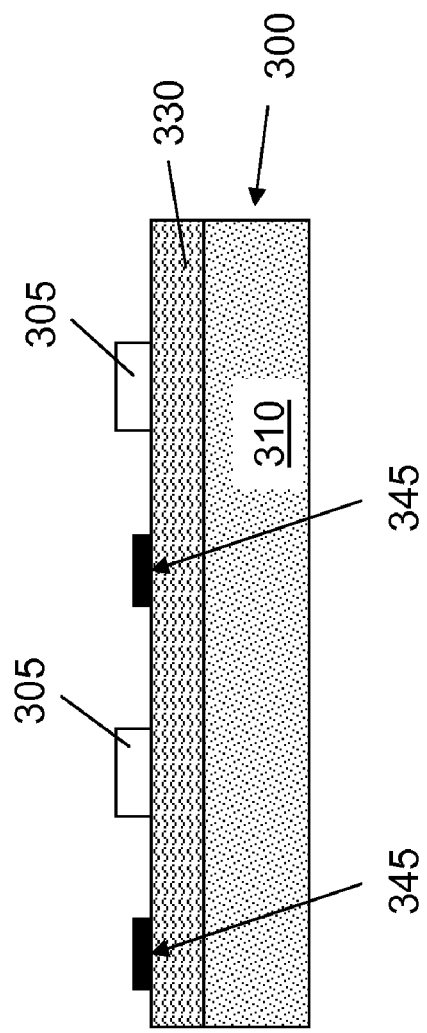
FIG. 3 is a cross-sectional view of a substrate having one or more micro devices.

Referring to FIGS. 1-3, an assembly 300 can include a substrate 310, a control layer 330, a plurality of micro devices 305 over the control layer 330, and a plurality of input/output (I/O) terminals 345 for the micro devices 305. The micro devices 305 can be, for example, built directly on top of the control layer 330 or built on a separate wafer that is bonded to the substrate 310. The substrate 310 can be any suitable support, such as a semiconductor wafer. The control layer 330 can include complimentary metal-oxide-semiconductor (CMOS) circuits. The control layer 330 includes electronic circuits that can provide input signals from the I/O terminals 345 to the micro devices 305 and output signals from the micro devices 305 to the I/O terminals 345. The terminals 345 can be distributed in a fan-out pattern to allow easy access and connection to external electronic interconnects. The micro device is a microstructure that can produce a mechanical movement, electromagnetic signals, acoustic signals, or optical signals in response to an input signal. For example, the micro device can include Micro-Electro-Mechanical Systems (MEMS) such as an array of tiltable micro mirrors, integrated circuits, micro sensors, micro actuators, and light emitting elements.

An encapsulation device 105 includes an encapsulation cover 110 and a plurality of spacer walls 121. The encapsulation cover 110 can include a plurality of openings 115 each providing access to the I/O terminals 345 for the micro devices 305, which allows the micro devices 305 to be tested on the substrate 310. The encapsulation cover 110 can be made of a transparent material such as glass to allow visual and microscopic examination of the micro devices 305. When the micro device 305 is an opto-electrical device (such as the device shown in FIG. 4), a transparent encapsulation cover 110 allows for optical communication with micro device 305. Antireflective layers 112 and 111 can be coated on the upper and lower surfaces of the encapsulation cover 110, respectively. The antireflective layers 111, 112 can reduce reflection and thus intensity loss of incident light and output light at the surfaces of the encapsulation cover 110. The spacer walls 121 can be bonded to the encapsulation cover 110 by, for example, plasma surface activated bonding, glass frit bonding deposited onto the encapsulation cover by electroplating, or adhered to the encapsulation cover 110 by an adhesive. Each spacer wall 121 includes one or more side faces 123 and a base face 122. The spacer walls 121 can be made of silicon, silicon oxides, glass or a metallic material. The spacer walls 121 define recesses 145 on the underside of the encapsulation cover 110. As described below, the base faces 122 can be bonded to the control layer 330 or directly to the substrate 310 to encapsulate the micro devices 305. An anti-stiction material 180 is within the recess, on either the spacer walls 121 and/or the encapsulation cover 110.

Figure 4:
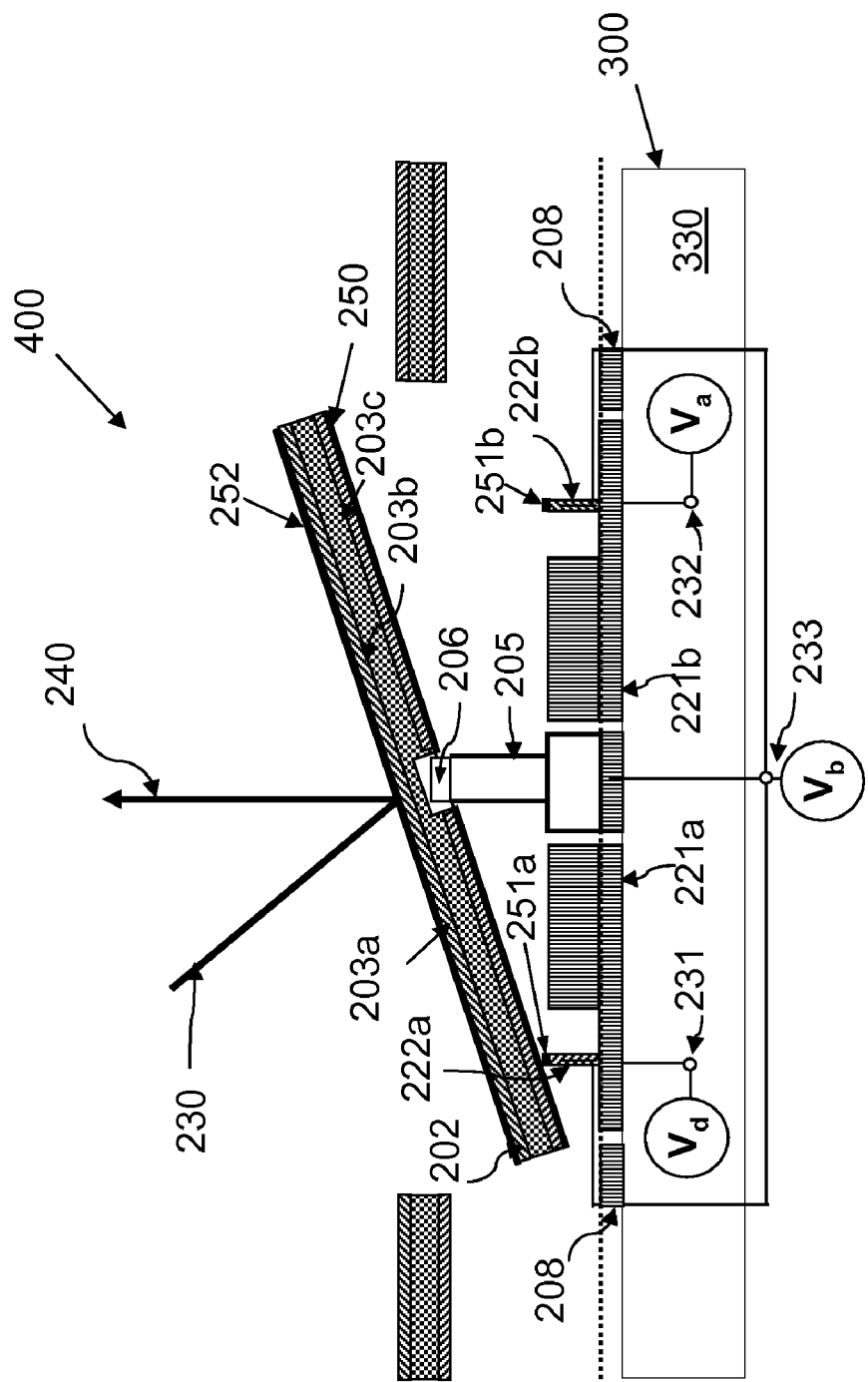
FIG. 4 is a side view of a micro mirror having surfaces applied with anti-stiction material.

FIG. 4 illustrates a micro mirror 400 type of micro device 305. The micro mirror 400 includes a mirror plate 202 that is tiltable around a hinge component 206. The hinge component 206 is supported by a post 205 that is connected to the control layer 330 in the assembly 300 (not shown in FIG. 4). The mirror plate 202 can include two or more layers, such as a hinge layer 203c, a spacer layer 203b, and a reflective layer 203a. The reflective layer reflects an incident light beam from direction 230 to direction 240. A pair of electrodes 221a and 221b can be formed on a hinge support frame 208 on the control layer 330. A pair of mechanical stops 222a and 222b can also be formed on the control layer 330 for stopping the tilt movement of the mirror plate 202 and defining precise tilt angles for the mirror plate 202. The hinge layer 203c can be made of an electrically conductive material. In some embodiments, the hinge layer 203c and the mechanical stops 222a and 222b are electrically connected to a common electrode 233. The electrodes 221a and 221b can be separately connected to electrodes 231 and 232. The control layer 330 includes an electric circuit in connection with the electrodes 231-233.

Electric signals can be applied to the electrodes 231-233 to produce electric potential differences between the hinge layer 203c and the electrodes 221a or 221b. Voltage signals produce electrostatic torque that can tilt the mirror plate 202, such as away from an un-tilted direction (which is may be parallel to the upper surface of the substrate 310). The tilting of the mirror plate 202 can apply torsion to the hinge (not shown). In turn, the hinge produces an elastic restoring force as the hinge is put under torsion. The torsional restoring force can pull the tilted mirror plate 202 back to the un-tilted position. The electrostatic torque can be sufficient to overcome the elastic restoring force to tilt the mirror plate 202 into contact with one of the mechanical stops 222a and 222b. The position of the mirror plate 202 in contact with the mechanical stops 222a or 222b can determine an "on" or an "off" position of the mirror plate and determine the direction 240 of the reflected light. Anti-stiction material can coat all surfaces of micro device, and can form layer 250 on the lower surface of the hinge layer 203c, and layers 251a and 251b on the upper surfaces of the mechanical stops 222a and 222b, respectively.

Figure 5:
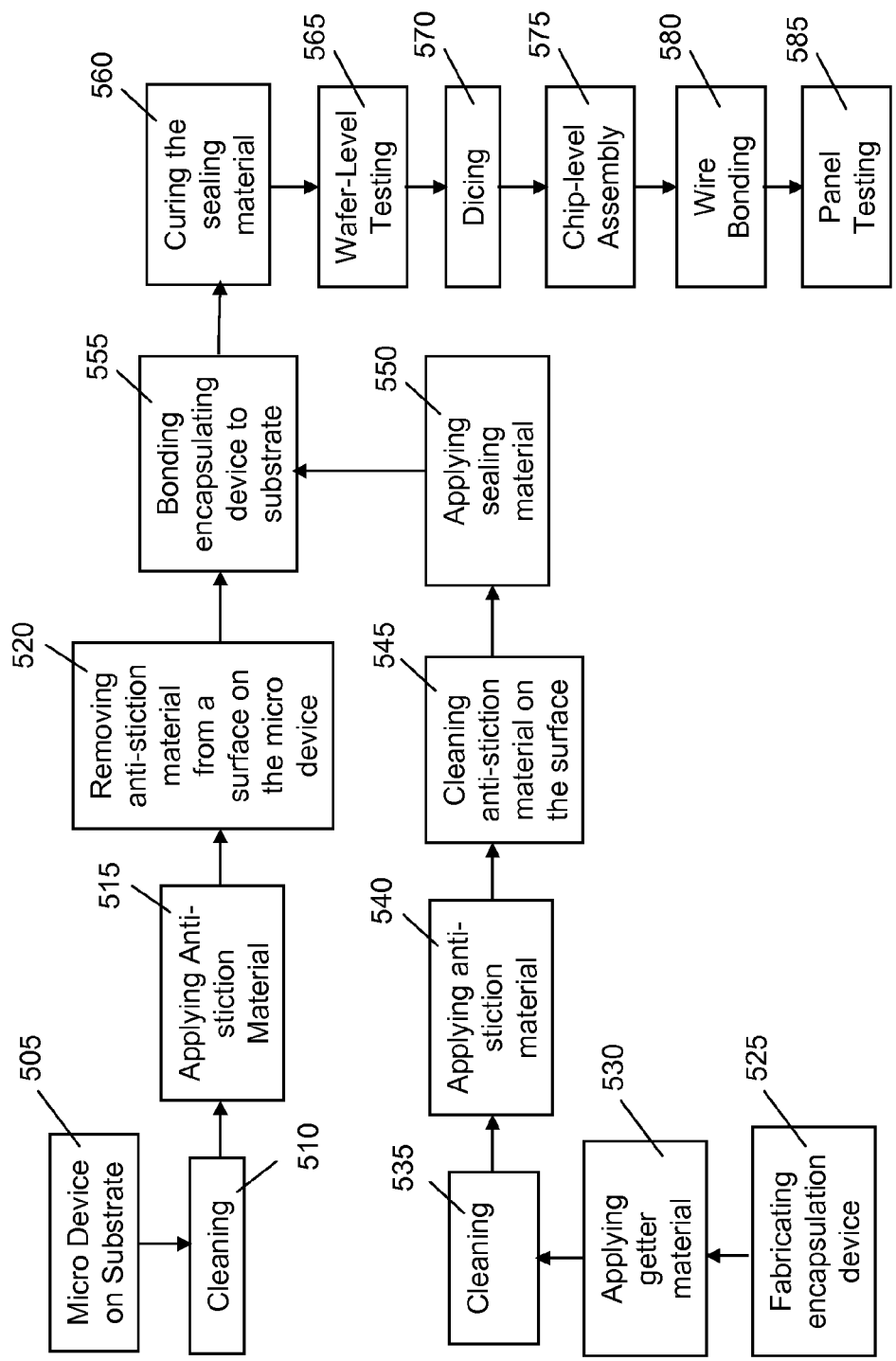
FIG. 5 is a flowchart for packaging and testing micro devices.

Referring to FIG. 5, a process for packaging and testing micro devices can include one or more of the following steps. Micro devices are first provided on a substrate as described above (step 505). The micro devices are optionally cleaned and the surface is activated, such as by a dry etching, for example, the surfaces can be exposed to low pressure, such as 20 millitorr to several Torr of argon or helium, downstream plasma (step 510). Cleaning the surfaces can allow for stronger bonding of anti-stiction material to the surface. An anti-stiction material is then deposited on the micro device, such as by vapor deposition (step 515). The anti-stiction material can be a material, such as tridecafluoro-1,1,2,2,-tetrahydrooctyl-trichlorosilane (FOTS) or heptadecafluoro-1,1,2,2,-tetrahydrooctyltrichlorosilane (FDTS), tridecafluoro-1,1,2,2,-tetrahydrooctyl triethoxysilane, bis-pentafluorophenyl dimethoxysilane, 3,3,3,-trifluoropropyl trichlorosilane, nonafluorohexyl trimethoxysilane, octadecyltrichlorosilane (OTS), perfluorodecanoic acid (PFDA), perfluoropolyether (PFPE) (e.g., Fomblin® PFPE) or a thiole. The anti-stiction material is deposited to form layers on all of the surfaces of the micro device, such as on a portions of the device that come into contact with one another, for example, the lower surface of the hinge layer, and the upper surfaces of the mechanical stops. Activating the surface on which the anti-stiction material is to be applied allows for the anti-stiction material to be chemisorbed onto the surface. The anti-stiction material coated on the contact surfaces of the device can help the moving potion of the device to overcome stiction at the contact locations and ensure timely device response. Because vapor deposition can deposit isotropically in all directions, anti-stiction material may also be deposited in undesirable locations, such as on the sealing surfaces. In some embodiments, to ensure that the anti-stiction material is not located in potentially undesirable locations, the anti-stiction material can be removed, such as by UV irradiation with ozone generation (step 520). UV irradiation can remove the anti-stiction material from the surface of the mirror plate, leaving the anti-stiction material in the pourous getter and under the mirror intact. Anti-stiction material can be globally removed in the areas that are exposed to UV radiation or anti-stiction material can be selectively removed in areas exposed to UV radiation while areas that are not exposed retain anti-stiction material.

The fabrication of the encapsulation device (step 525) can optionally include forming applying antireflective layers and on the upper and lower surfaces of the encapsulation cover and openings in the encapsulation cover. The encapsulation cover can be made of a transparent material, such as glass, plastic, resin or other suitable material. An aperture layer (not shown) can optionally be formed on the lower surface of the encapsulation cover. The aperture layer can have openings over the micro devices to allow for visual inspection, and optical communication with the micro devices, if needed. The aperture layer is made of a semi- or fully opaque material and can block and/or absorb stray light. The spacer walls are bonded to the lower surface of the encapsulation cover, such as by surface plasma bonding, glass fritting, electroplating or adhered to the lower surface of the encapsulation cover by for example a polymeric adhesive.

A getter material is applied to the encapsulation cover and/or spacer walls (step 530). A getter material can include for example dehydrated metal halides, salts, silicates, oxides such as silicone oxide and calcium oxide, hydroxides, halides, sulphates, perchlorates, carbonates, activated carbon or a combination thereof. The getter material can include particles made of these materials dispersed in a solvent. The dispersion containing the getter material is applied to a surface in the recess. The dispersion can be dispensed by a fluidic delivery head on the lower surface of the encapsulation cover or a side surface of the spacer wall. The location of the getter material is selected such that the getter material will not interfere with the optical signals through the encapsulation cover. For example, the getter material can be placed at a corner of the recess or on the sides of the recess. In some embodiments, if the encapsulation cover has an aperture layer formed on its lower surface, the getter material is placed on the lower surface of the aperture layer. The solvent in the dispersion evaporates to form a porous desiccate material having pores between the particles.

In some embodiments, the getter material is impregnated with anti-stiction material and serves as a reservoir for the anti-stiction material. The encapsulation device having the getter material is optionally cleaned to remove any debris or particles produced in the fabrication of the encapsulation device (step 535). The cleaning step can be similar to step 510, described above. The encapsulation device is then placed in a vapor of an anti-stiction material. The anti-stiction material is absorbed by the porous structure of getter material without requiring chemical changes to the getter material or in the anti-stiction material. If any of the anti-stiction material is deposited on portions of the encapsulation cover where it is undesirable to have anti-stiction material, such as portions that must remain free from anti-stiction material to be able to be bonded to other components, these portions are cleaned, such as by described above, with UV irradiation with ozone formation (step 545). The cleaning step may also remove some of the anti-stiction material on the surfaces of the getter material, but the anti-stiction material absorbed in the bulk of the getter material should remain to be unaffected.

Optionally, a sealing material, such as a polymer adhesive (e.g., epoxy) is applied to portions of the encapsulation cover and/or a substrate or assembly that is to be bonded together (step 550). The sealing material can be dispensed by a fluidic delivery device similar to an ink jet print head. Alternatively, the base faces of the spacer walls bonded to the underside of the encapsulation cover can be stamped in a layer of the sealing material to receive the sealing material. The base faces of the spacer walls are then brought into contact with the control layer and bonded together (step 555). The bonding step can be conducted in a vacuum environment or other controlled environment.

As a result, micro devices are encapsulated in chambers with a portion of the encapsulation cover above the micro device. The device can be in a vacuum or partial vacuum environment or controlled atmosphere at ambient pressure, which can be maintained by the sealing. The curing of the sealing material can be assisted by UV curing and/or heating (step 560).

The micro devices can be tested by applying electric signals to the micro device and measuring mechanical movement of the micro device or output signals produced by the micro device (step 565). The electric signals can be applied and received at the I/O terminals. The micro devices and encapsulation cover are diced and cut into individual dies (step 570). The dies can subsequently undergo processing steps such as chip-level assembly (step 575), wire bonding (step 580), encapsulation of the wire bonds and panel-level testing (step 585). Details about the encapsulation and dicing of the micro devices are disclosed in the pending U.S. patent application Ser. No. 11/379,932, titled "Micro device encapsulation", filed Apr. 24, 2006, which is incorporated by reference herein for all purposes.

Figure 6:
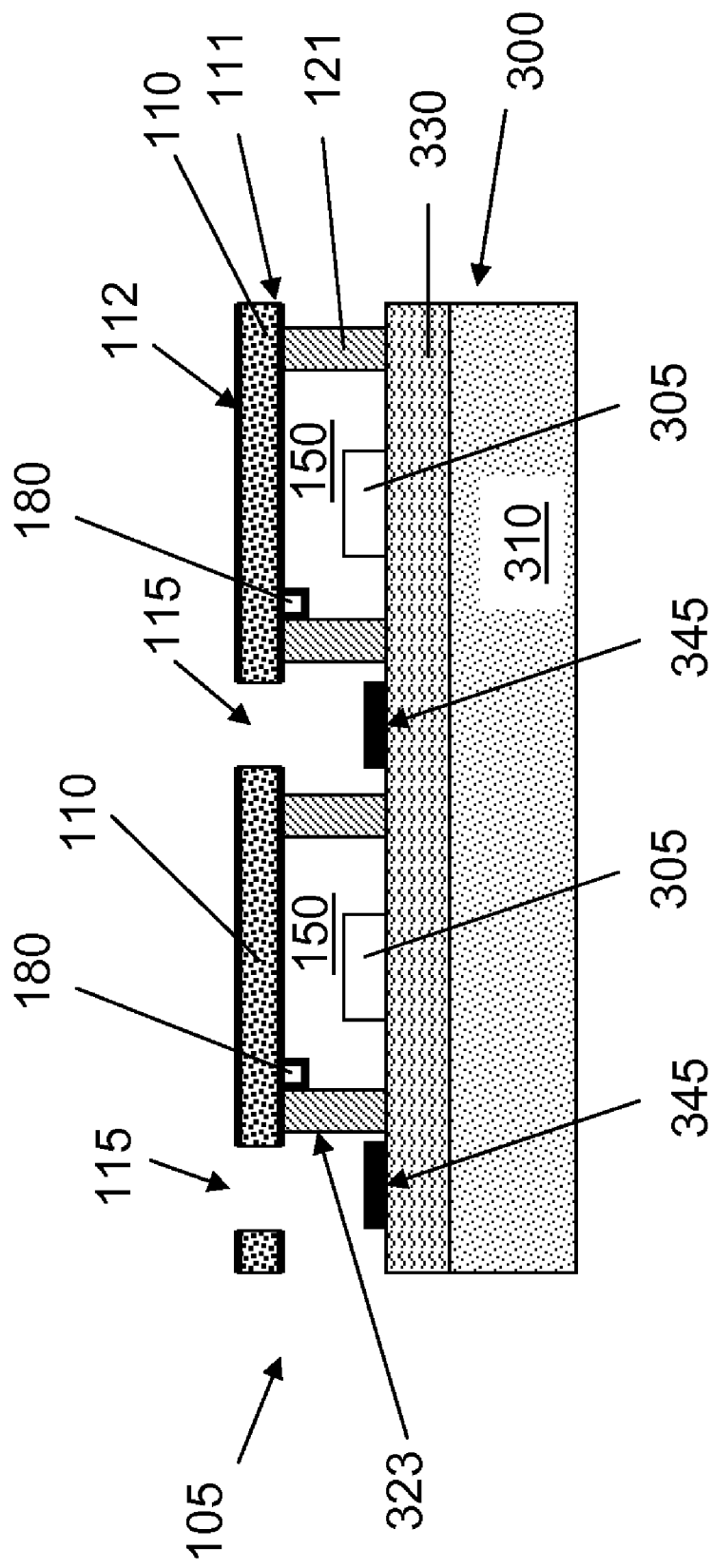
FIG. 6 is a cross-sectional view of the substrate carrying the one or more micro devices encapsulated by the encapsulation device of FIG. 3.

Referring to FIG. 6, the getter material 180 is encapsulated in the chambers 150 together with the micro devices 305. During the operation of the micro devices 305, such as a micro mirror as shown in FIG. 4, the anti-stiction materials 250, 251a and 25b coated on the lower surface of the hinge layer 203c and the upper surfaces of the mechanical stops 222a and 222b may be depleted during the repeated contacts between the these surfaces. The anti-stiction material absorbed by the getter material 180 can serve as a reservoir of anti-stiction material and can maintain a vapor pressure of the anti-stiction material in the chambers 150. The vapor of the anti-stiction material can replenish anti-stiction material at the surfaces on the hinge layer 203c and the mechanical stops 222a and 222b that can contact each other during the operations of the micro mirror 400.

In some embodiments, the anti-stiction material is removed during fabrication to eliminate the anti-stiction material from particular surfaces, such as a mirror surface. When the anti-stiction material absorbed by the getter material is released and replenishes the contact surfaces, the anti-stiction material is not sufficiently thick to affect the optical properties, that is, reflectivity, of the mirror surface.

Embodiments of the systems and methods disclosed herein include one or more of a number of advantages. The getter material can absorb moisture in the chamber. It is known that moisture can affect the proper operation of the micro devices. For example, moisture can increase the adhesion between the lower surface of the hinge layer and the upper surfaces of the mechanical stops, which may affect the separation of the mirror plate from mechanical stops, and thus the tilt movement of the mirror plate. Moisture is also known to be harmful to organic light emitting diode (OLED) and liquid crystal display (LCD) devices. A getter material in a chamber encapsulating a micro device can effectively remove moisture in the chamber and keep water concentration in the chamber at a very low level. A getter material can also absorb organic materials that outgas into the chamber. In addition, the getter material can absorb anti-stiction material and provide a vapor of the anti-stiction material, which can replenish the anti-stiction material on the surfaces of the micro device during operation. Anti-stiction material can be applied to the surfaces of micro devices before they are encapsulated. The anti-stiction material on the undesired surfaces of the micro device can also be selected removed. A plurality of micro devices can be simultaneously encapsulated in chambers at high throughput.

It is understood that the disclosed systems and methods are compatible with different techniques and materials in addition to the ones described above. For example, the steps of the method described herein can be performed in a different order. After the curing of the sealing material, an additional sealing material may be deposited on the outer surfaces of the chamber which may hermetically seal the chambers. The spacer walls may also include sloped surfaces to receive the anisotropic deposition of the additional sealing materials. Moreover, the base faces of the spacer walls can also be bonded to the upper surface of the substrate by plasma surface activated bonding, thermocompression, soldering, adhesive bonding.

What is claimed is:

1. An encapsulated device, comprising:
    a micro device on a substrate;
    a cover bonded to the substrate thereby forming a chamber to encapsulate the micro device; and
    a desiccant material in the chamber, wherein the desiccant material is porous and an anti-stiction material is absorbed in pores of the desiccant material.

2. The encapsulated device of claim 1, wherein the desiccant material comprises at least one of a dehydrated metal halide, salt, silicate, oxide, hydroxide, halide, sulphate, perchlorate, carbonate, or activated carbon.

3. The encapsulated device of claim 2, wherein the desiccant material comprises calcium oxide or silicon oxide.

4. The encapsulated device of claim 1, wherein the anti-stiction material comprises at least one of tridecafluoro-1,1,2,2,-tetrahydrooctyltrichlorosilane (FOTS), heptadecafluoro-1,1,2,2,-tetrahydrooctyltrichlorosilane (FDTS), tridecafluoro-1,1,2,2,-tetrahydrooctyl triethoxysilane, bis-pentafluorophenyl dimethoxysilane, 3,3,3,-trifluoropropyl trichlorosilane, nonafluorohexyl trimethoxysilane, octadecyltrichlorosilane (OTS), perfluorodecanoic acid (PFDA), perfluoropolyether (PFPE) or a thiole.

5. The encapsulated device of claim 1, wherein the micro device comprises a first component configured to move and contact a second component.

6. The encapsulated device of claim 5, further comprising an anti-stiction material on at least one of the first component or the second component to prevent stiction between the first component and the second component.

7. The encapsulated device of claim 1, further comprising a spacer on the cover, wherein the spacer is bonded to the substrate.

8. The device of claim 1, wherein vapor from the anti-stiction material absorbed in the disscant material serves to replenish anti-stiction material on surfaces of the micro device in the chamber.

9. The encapsulated device of claim 1, wherein the desiccant material comprises a silicate.

* * * * *